US006265320B1

United States Patent
Shi et al.

(10) Patent No.: US 6,265,320 B1
(45) Date of Patent: Jul. 24, 2001

(54) METHOD OF MINIMIZING REACTIVE ION ETCH DAMAGE OF ORGANIC INSULATING LAYERS IN SEMICONDUCTOR FABRICATION

(75) Inventors: Jianou Shi, Milpitas; Thomas W. Mountsier, San Jose; Mary Anne Plano, Mountain View; Joseph R. Laia, Morgan Hill, all of CA (US)

(73) Assignee: Novellus Systems, Inc., San Jose, CA (US)

(*) Notice: Subject to any disclaimer, the term of this patent is extended or adjusted under 35 U.S.C. 154(b) by 0 days.

(21) Appl. No.: 09/467,389

(22) Filed: Dec. 21, 1999

(51) Int. Cl.$^7$ .................................................. H01L 21/302
(52) U.S. Cl. ...................... 438/725; 134/1.2; 134/1.3; 216/67; 438/706; 438/715; 438/734
(58) Field of Search .................. 134/1.2, 1.3; 216/67; 438/706, 710, 715, 723, 725, 734

(56) References Cited

U.S. PATENT DOCUMENTS

| | | | | |
|---|---|---|---|---|
| 4,357,203 | * | 11/1982 | Zelec ..................................... | 156/643 |
| 5,567,271 | * | 10/1996 | Chu et al. .......................... | 156/659.1 |
| 5,660,682 | * | 8/1997 | Zhao et al. ............................ | 438/715 |
| 6,001,539 | * | 12/1999 | Lyu et al. .............................. | 430/317 |

FOREIGN PATENT DOCUMENTS

10209118 * 8/1998 (JP) .

OTHER PUBLICATIONS

"Elements of Materials Science & Engineering"; Van Vlack; Addison–Wesley Publishing Co.; Reading, Mass; 4th. ed.; ©1980; pp. 524, 413.*
"Hydrogen Plasma Removal of Post–RIE Residue For Backend Processing"; Jun. 17, 1999; J. Elect., Soc., 146(6), pp. 2318–2321.*
Wolf et al., "Dry Etching For VLSI Fabrication", *Silicon Processing for the VLSI Era* vol. 1, Chapter 16, pp. 539–581, 1986.

* cited by examiner

*Primary Examiner*—Gregory Mills
*Assistant Examiner*—George Goudreau
(74) *Attorney, Agent, or Firm*—Skjerven Morrill MacPherson LLP; Roberta P. Saxon

(57) ABSTRACT

A method of limiting surface damage during reactive ion etching of an organic polymer layer on a semiconductor substrate combines particular choices of process gases and plasma conditions with a post-etch passivation treatment. According to the method, a low density plasma etcher is used with a process gas mixture of one or more of an inert gas such as argon, helium, or nitrogen; methane; hydrogen; and oxygen, where the percentage of oxygen is up to about 5%. Typically a parallel plate plasma etcher is used. The reactive ion etching is followed by a post-etch passivation treatment in a which a gas containing hydrogen is flowed over the etched layer at an elevated temperature. The method is particularly useful in reactive ion etching of fluorinated organic polymer layers such as films formed from parylene AF4, and layers of poly(arylene ethers) and TEFLON®.

20 Claims, 2 Drawing Sheets

METHOD OF MINIMIZING REACTIVE ION ETCH DAMAGE OF ORGANIC INSULATING LAYERS IN SEMICONDUCTOR FABRICATION

TECHNICAL FIELD

This invention relates generally to methods of semiconductor device fabrication and, in particular, to methods of minimizing reactive ion etch damage of organic insulating layers during semiconductor device fabrication.

BACKGROUND

As feature sizes in integrated circuits are decreased to 0.18 μm and below, issues of signal delay, power consumption, and crosstalk become increasingly significant. Miniaturization generally results in increased crosstalk or capacitive coupling between conductors which is associated with increased signal delay. One way to diminish capacitive coupling is to decrease the dielectric constant of the insulating material which separates conducting paths.

Silicon dioxide ($SiO_2$) has long been used in integrated circuits as the primary insulating material. With a dielectric constant of approximately 4, $SiO_2$ has a relatively low dielectric constant for an inorganic material. One option for achieving a dielectric material with a lower dielectric constant is to use organic or polymeric materials. For example, a class of poly-p-xylylenes termed parylenes has been identified as candidate insulating materials. Parylene films derived from the parylene AF4 dimer, chemical name octafluoro-[2,2]paracyclophane, have dielectric constants down to 2.24 and other variants are being tested which may have even lower dielectric constants. Fluorinated poly (arylene ethers) have also been identified as low dielectric constant materials and polytetrafluoroethylene, known commercially as TEFLON®, or related fluoropolymers are known to have dielectric constants down to approximately 1.7.

Fabrication of integrated circuit devices typically requires numerous processing steps to deposit and pattern multiple layers of conducting and insulating materials. One of these processing steps is reactive ion etching (RIE), which uses chemically reactive radicals and ions to remove material from a surface of a semiconductor device to produce desired features. Reactive Ion Etching is described, for example, in Chapter 16 of Wolf and Tauber, *Silicon Processing for the VLSI Era Vol*1. [Lattice Press, 1986] which lists process gases conventionally used to etch different materials. For organic solids, oxygen or gas mixtures including oxygen are conventionally used. However, exposure of a layer of a fluorinated organic polymer such as AF4 to an RIE plasma conventionally used for organic materials, results in plasma surface damage leading to reduced thermal stability of the etched AF4 surface.

What is needed is a way to minimize RIE etch damage so that low dielectric constant organic polymer insulators can be readily integrated with typical semiconductor fabrication processes.

SUMMARY

A method of limiting surface damage during reactive ion etching of an organic polymer layer on a semiconductor substrate combines particular choices of process gases and plasma conditions with a post-etch passivation treatment. According to the method, a low density plasma etcher is used with a process gas mixture of one or more of an inert gas such as argon, helium, or nitrogen; methane; hydrogen; and oxygen, where the percentage of oxygen is up to about 5%. Gas mixtures containing between about 2% and about 4.5% oxygen, about 3% methane, and the remainder an inert gas are used in the method. A second example is a mixture that is 75% nitrogen and 25% hydrogen. The ion density of the low density plasma is between about $10^9$ and about $10^{10}$ ions/$cm^3$. Typically a parallel plate plasma etcher is used.

The reactive ion etching is followed by a post-etch passivation treatment in which hydrogen or a mixture of greater than 50% hydrogen in nitrogen is flowed over the etched layer at a temperature between about 350° C. and 450° C. The method limits surface damage in reactive ion etching of fluorinated organic polymer layers such as films formed from parylene AF4, and layers of poly(arylene ethers) and TEFLON®.

BRIEF DESCRIPTION OF THE DRAWINGS

The use of the same reference symbols in different drawings indicates identical or similar items.

DETAILED DESCRIPTION

A method of removing material in a semiconductor structure that combines particular choices of process gases and plasma conditions with a post-etch passivation treatment minimizes surface damage to polymer insulating materials.

Figure 1:
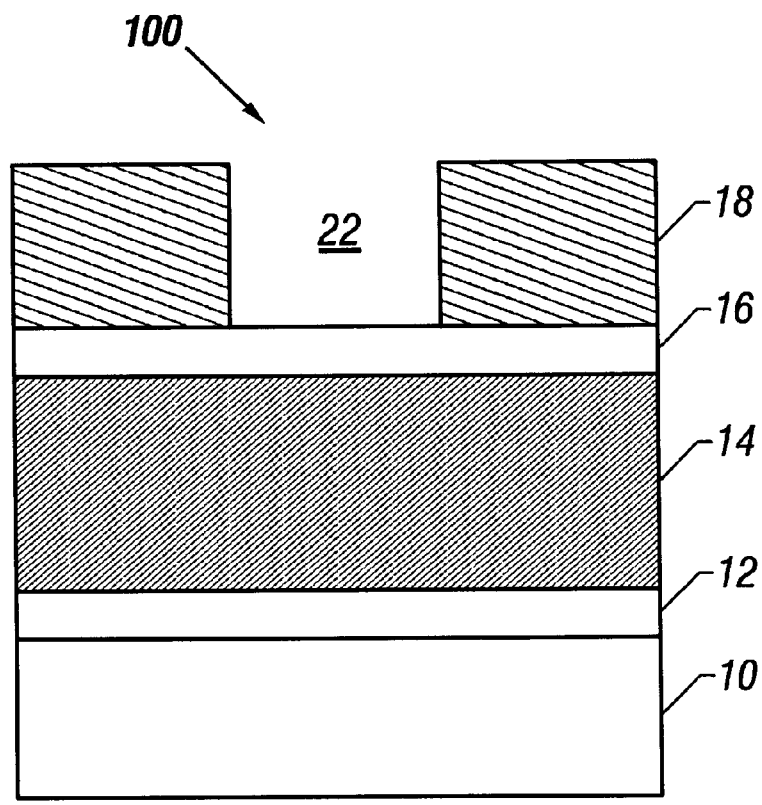
FIG. 1 shows a structure in which a trench is to be etched according to the present invention.
Figure 2:
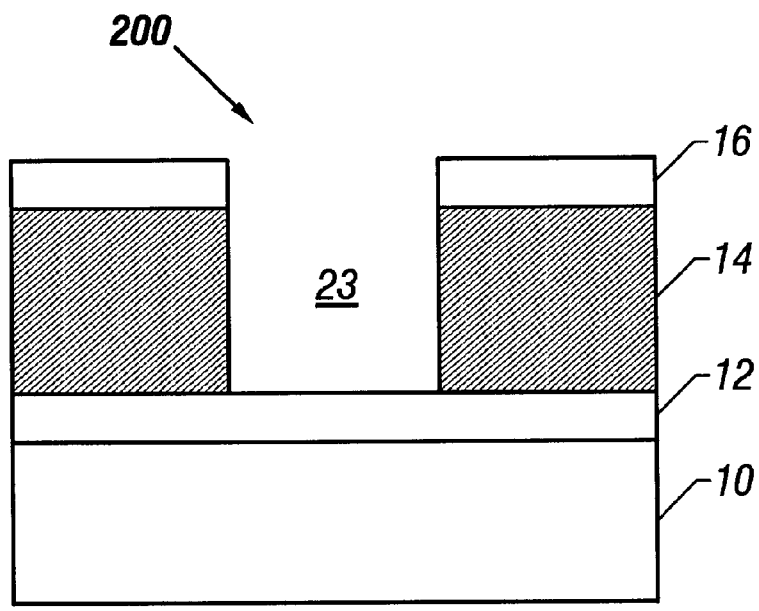
FIG. 2 shows the structure of FIG. 1 after the trench has been etched.

FIG. 1 illustrates a semiconductor structure 100 in which a trench is to be etched and inlaid with copper to form a single damascene structure. Structure 100 includes a thin silicon nitride etch stop layer 12 overlying a silicon wafer 10. A layer of insulating material 14 covers the etch stop layer 12 and is covered by a hardmask layer 16, for example a silicon oxynitride layer. A patterned photoresist layer 18 with opening 22 overlying the hardmask layer 16 serves as a mask for etching a trench through opening 22 into insulating material 14. The resulting structure 200 containing trench 23 is shown in FIG. 2.

As discussed above, it may be desirable to use organic polymeric materials for insulating layer 14 because of their low dielectric constants. Conventional reactive ion etching (RIE) of organic materials uses oxygen or mixtures of oxygen and fluorine-containing gases as the process gases. However, particularly when fluorinated organic polymers such as parylenes, fluorinated poly(arylene ethers) and TEFLON® or related fluoropolymers are used for insulating layer 14, conventional RIE processes may result in surface damage to sidewalls 20, shown in FIG. 2. As described in the background section, parylenes refer to a class of poly p-xylylenes derived from dimers of substituted benzene rings. Films derived from the fluorinated parylene dimer denoted AF4, octafluoro-[2,2]paracylophane, have been used as insulating materials. Other parylenes denoted parylene C, D, and N, which have two chlorine, one chlorine, and no substituents, respectively, per benzene ring, are also known.

According to the present invention, an RIE process gas mixture for etching organic polymer materials uses one or more of an inert gas, such as argon, helium, or nitrogen; methane ($CH_4$); and hydrogen. The process gas mixture may additionally contain up to about 5% oxygen. For example, gas mixtures containing between about 2% and about 4.5% oxygen, about 3% methane, and the remainder an inert gas are useful in the invention. A second example is a mixture that is 75% nitrogen and 25% hydrogen. To produce structure 200, first an opening is etched in hardmask layer 16 using conventional process gases for silicon oxides and nitrides. Then, insulating layer 14 is etched using the RIE process gas mixture of the present invention. Because photoresist is an organic material, typically, photoresist layer 18 is completely removed during the RIE of trench 23 in organic insulating layer 14, resulting in structure 200 which has no photoresist layer.

In reactive ion etching, a reaction chamber containing the wafer is filled with process gases and a plasma is created by applying radio frequency power between a pair of electrodes. In the present method, a parallel plate plasma reactor is to used to create a low density plasma with ion density between about $10^9$ and about $10^{10}$ ions/cm$^3$. For example a Lam Research Model 4520 XL parallel plate reactor is used with the process gas mixture described above to etch the trench in insulating layer 14.

The method additionally includes a post-etch passivation treatment consisting of a thermal anneal step. In the thermal anneal step, hydrogen or a mixture of greater than 50% hydrogen in nitrogen is flowed over the etched structure 100 at a temperature between about 350° C. and about 450° C. A typical flow rate for the thermal anneal step is between about 100 and about 3000 standard cubic centimeters per minute (sccm) at a total pressure less than 700 torr. Typical anneal durations are between about 10 minutes and about 2 hours. Other reducing agents such as methane can alternatively be used.

Figure 3:
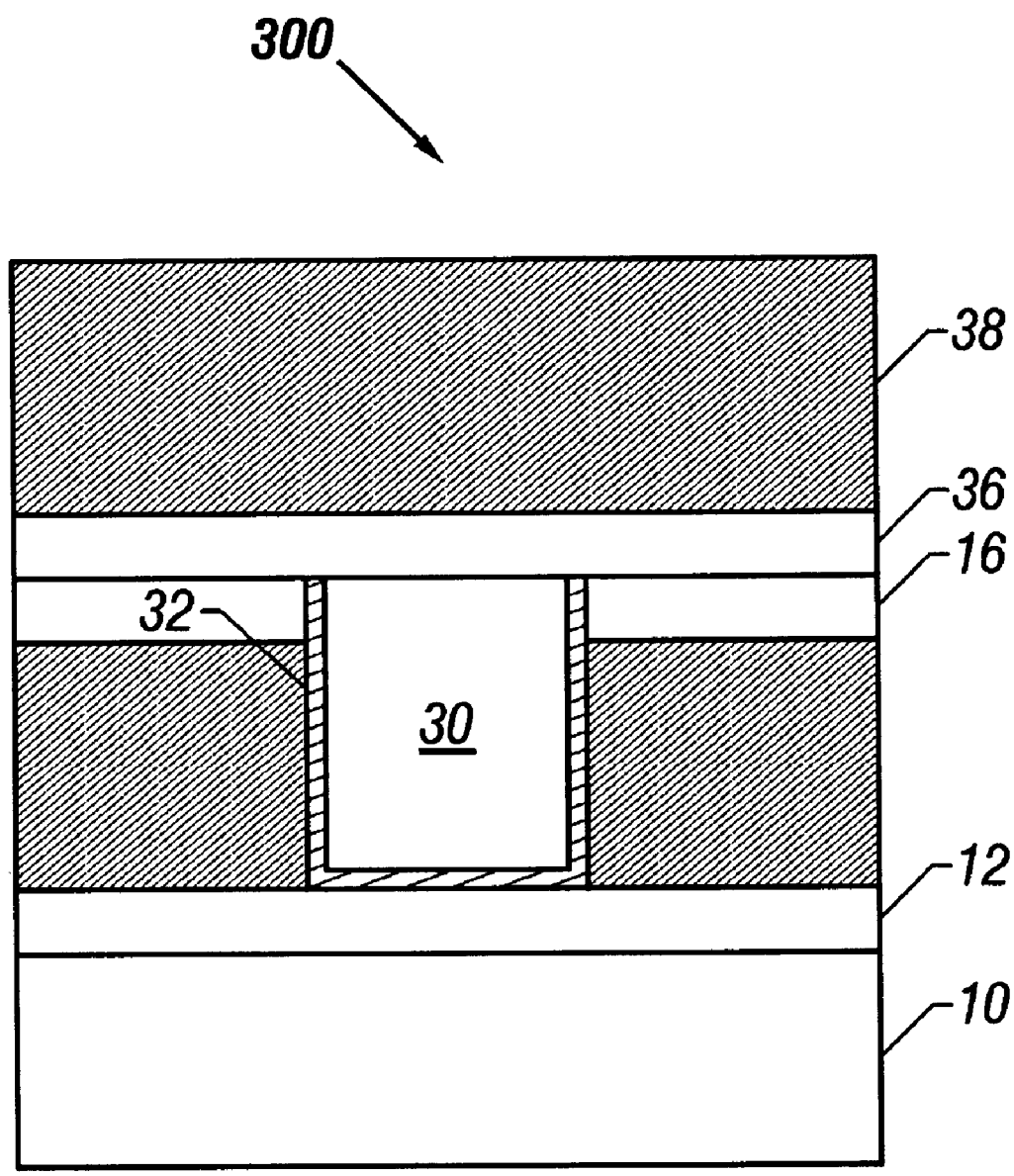
FIG. 3 shows a test structure for demonstrating the benefits of the present invention.

A typical semiconductor device includes multiple layers on top of conducting lines such as the lines resulting when trench 23 is filled with metal. Fabrication of such devices requires multiple process steps. At various stages during fabrication, the device is subjected to high temperatures. If the RIE process has resulted in surface damage to sidewalls 20, when the device is subjected to high temperatures, blistering of the top layers is observed. The blistering is believed to result from outgassing from damaged sidewalls 20. Tests with a test structure 300, shown in FIG. 3 demonstrate that when fluorinated organic polymer insulating layers are etched according to the present method, surface damage is minimized.

Test structure 300 includes a 1000Å thick silicon nitride layer 12, a 1 μm thick layer 14 of parylene AF4, and a 1000Å thick silicon oxynitride hardmask layer 16 overlying the insulating layer. The trench 32 in the parylene layer 14 is lined with a 300Å thick tantalum nitride barrier layer 30 and filled with copper. A 1000Å thick silicon nitride layer 36 overlies the hardmask layer 16 and copper filled trench 32, topped with a 1 μm thick layer 38 of parylene AF4. Test structure 300 was heated to 400° C. in a furnace in vacuum or in a nitrogen and air ambient for a period of four hours. Blistering was determined by visual inspection. In addition, gases emitted from the sample were analyzed by gas chromatography/mass spectrometry (GC/MS). A characteristic peak resulting from fluorine gas interaction with a quartz collection vessel was monitored. As reported in the examples below, when an organic polymer layer such as parylene AF4 is etched with a process gas mixture consisting of between about 2 and about 4.5% oxygen, about 3% methane, and the remainder nitrogen or argon, using a low density plasma reactor, and the etch is followed by a post-etch passivation treatment, little or no blistering was observed and little or no evidence of fluorine outgassing was observed. Similar results were obtained for etching with a gas mixture of 75% nitrogen and 25% hydrogen.

Without being bound to any theory, the inventors explain the mechanism of the present method by the following chemical interactions. If a film derived from parylene AF4, for example, is etched with a conventional RIE process, interaction with reactive radicals, ions, and ultraviolet radiation induces bond breakage at the surface, leading to fluorine atoms trapped in the film. These fluorine atoms are subsequently released on heating. Furthermore, the parylene film is partially oxidized by reactions with process gases that include large amounts of oxygen to form carbonyl groups that are labile at low temperature resulting in CO outgassing. Outgassing problems are avoided in the present method by using a low density parallel plate plasma reactor, which has very limited radiation at wavelengths below 300 nanometers, and by severely limiting the amount of oxygen in the process gas mixture.

The method additionally includes a post-etch passivation treatment at elevated temperatures with a gas containing hydrogen. Reaction with hydrogen removes the free fluorine atoms, terminates the broken bonds in the film, and reduces any carbonyl groups to more stable CH groups. Thus a post-etch anneal enhances thermal stability of the etched parylene film.

The benefits of the present method are further illustrated in the following examples.

EXAMPLE 1

Multiple examples of structure 100 were prepared containing a 1 μm thick layer of parylene AF4 as insulating layer 14, hardmask layer 16, and etch stop layer 12 as in structure 300. The structures were placed in a Lam Research model 9100 high density plasma etcher. Openings were etched in the silicon oxynitride hardmask layer with conventional fluorocarbon process gases. The parylene AF4 layers were etched with the process gas mixtures listed below in Table 1. A post etch passivation treatment of 5000 sccm of $H_2$ for 120 minutes at 400° C. was applied to some of the etched structures. The etched trenches were lined, copper filled, and covered with silicon nitride and parylene layers to create test structures 300, which were heated to 400° C. in vacuum for 30 minutes. Emitted gases were collected in a quartz vessel and analyzed by GCIMS. The heights of the mass 85 ($SiF_3$) peak, resulting from reaction of fluorine atoms with the quartz walls of the collecting vessel were observed. Blistering was scored by inspection where 1 denotes minor blistering and 5 denotes extreme blistering. Degree of blistering and relative mass 85 peak heights for structures processed with and without a post-etch passivation treatment are recorded in Table 1.

TABLE 1

Etching of parylene AF4 layer in a high density plasma etcher

| Process gases (sccm) | No post-etch treatment | With post-etch treatment | GC mass 85 relative peak height (with post-etch treatment) |
|---|---|---|---|
| 50 $N_2$/50 $H_2$/5 $O_2$ | Blistered 4 | Blistered 2 | Medium |
| 50 Ar/50 $H_2$/5 $O_2$ | Blistered 5 | Blistered 4 | High |
| 95 $N_2$/5 $H_2$/5 $O_2$ | Blistered 5 | Blistered 4 | High |
| 25 $CO_2$/14 $N_2$/0.3 $H_2$ | Blistered 5 | Blistered 3 | High |

EXAMPLE 2

Structures were prepared and processed analogously as in Example 1 using a Lam Research model 4530 XL parallel plate plasma etcher. Results are recorded in Table 2 below.

TABLE 2

Etching of parylene AF4 layer in a parallel plate plasma etcher

| Process gases (sccm) | No post-etch treatment | With post-etch treatment | GC mass 85 relative peak height (with post-etch treatment) |
|---|---|---|---|
| 300 $N_2$/10 $CH_4$/8 $O_2$ | Blistered 2 | No blisters | None |
| 300 Ar/10 $CH_4$/15 $O_2$ | Blistered 3 | Blistered 1 | Low |
| 500 $N_2$/16 $CH_4$/8 $O_2$ | Blistered 3 | Blistered 1 | Low |
| 300 $N_2$/100 $H_2$ | Blistered 3 | Blistered 1 | Low |
| 300 $N_2$/100 $H_2$/5 $CF_4$ | Blistered 4 | Blistered 2 | Medium |
| 100 He/100 $H_2$/5 $CF_4$ | Blistered 4 | Blistered 2 | Medium |

It will be observed that in all cases, post-etch passivation treatment reduces the level of blistering. It will further be observed that excellent results, defined as no blisters or blister level 1 and no or low mass 85 peak, are obtained with the parallel plate etcher with process gas mixtures containing less than about 5% oxygen, about 3% methane and the remainder nitrogen or argon. Excellent results are also obtained for a process gas mixture of nitrogen and hydrogen.

Although the invention has been described with reference to specific structures, materials, and processes, the description is only an example of the invention's application and should not be taken as a limitation. In particular, while application to fluorinated organic polymer insulating materials has been emphasized, the process is applicable broadly to organic polymer insulating materials. Various adaptations and combinations of features of the process disclosed are within the scope of the invention as defined by the following claims.

We claim:

1. A method of removing material from an organic polymer layer on a semiconductor substrate, the method comprising:

a first act of exposing the polymer layer to a low density plasma created in a process gas mixture comprising one or more gases selected from the group consisting of inert gases, methane, hydrogen, and oxygen, wherein the percentage of oxygen in the process gas mixture is less than about 5%; and a second act of thermally annealing the polymer layer in a treatment gas containing hydrogen at a temperature above about 350° C., wherein the first act is different from the second act.

2. The method of claim 1 wherein the low density plasma has an ion density between about $10^9$ and $10^{10}$ ions per cubic centimeter.

3. The method of claim 1 wherein the low density plasma is created in a parallel plate plasma reactor.

4. The method of claim 1 wherein the process gas mixture comprises between about 2% and about 4.5% oxygen, between about 0% and about 4% methane, and the remainder is an inert gas.

5. The method of claim 4 wherein the inert gas is nitrogen.

6. The method of claim 4 wherein the inert gas is argon.

7. The method of claim 1 wherein the process gas mixture comprises nitrogen and hydrogen.

8. The method of claim 1 wherein the treatment gas comprises hydrogen and nitrogen wherein the percentage of hydrogen is greater than 50%.

9. The method of claim 1 wherein the treatment gas is hydrogen.

10. The method of claim 1 wherein the organic polymer layer is a layer of a fluorinated organic polymer.

11. The method of claim 10 wherein the fluorinated organic polymer layer is a layer selected from the group consisting of a film derived from parylene AF4, a fluorinated poly(arylene ether) film, and a polytetrafluoroethylene film.

12. A method of limiting surface damage to the sidewalls of a trench formed by reactive ion etching of an organic polymer layer on a semiconductor substrate, the method comprising:

a first act of exposing the polymer layer to a low density plasma created in a process gas mixture comprising one or more gases selected from the group consisting of inert gases, methane, hydrogen, and oxygen, wherein the percentage of oxygen in the process gas mixture is less than about 5–%, wherein a trench is formed; and a second act of thermally annealing the trench in a treatment gas containing hydrogen at a temperature above about 350° C., wherein the first act is different from the second act.

13. The method of claim 12 wherein the low density plasma has an ion density between about $10^9$ and $10^{10}$ ions per cubic centimeter.

14. The method of claim 12 wherein the low density plasma is created in a parallel plate plasma reactor.

15. The method of claim 12 wherein the process gas mixture comprises between about 2% and about 4.5% oxygen, between about 0% and about 4% methane, and the remainder is an inert gas.

16. The method of claim 12 wherein the process gas mixture comprises nitrogen and hydrogen.

17. The method of claim 12 wherein the treatment gas comprises hydrogen and nitrogen wherein the percentage of hydrogen is greater than 50%.

18. The method of claim 12 wherein the treatment gas is hydrogen.

19. The method of claim 12 wherein the organic polymer layer is a layer of a fluorinated organic polymer.

20. The method of claim 19 wherein the fluorinated organic polymer layer is a layer selected from the group consisting of a film derived from parylene AF4, a fluorinated poly(arylene ether) film, and a polytetrafluoroethylene film.

* * * * *